US012206398B2

(12) United States Patent
Handt et al.

(10) Patent No.: US 12,206,398 B2
(45) Date of Patent: Jan. 21, 2025

(54) SWITCHING DEVICE FOR A DC VOLTAGE GRID AND OPERATING METHOD FOR THE SWITCHING DEVICE

(71) Applicant: Siemens Aktiengesellschaft, Munich (DE)

(72) Inventors: Karsten Handt, Berg (DE); Stefan Hänsel, Spardorf (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 17/925,634

(22) PCT Filed: Mar. 9, 2021

(86) PCT No.: PCT/EP2021/055834
§ 371 (c)(1),
(2) Date: Nov. 16, 2022

(87) PCT Pub. No.: WO2021/239283
PCT Pub. Date: Dec. 2, 2021

(65) Prior Publication Data
US 2023/0198518 A1  Jun. 22, 2023

(30) Foreign Application Priority Data
May 26, 2020 (EP) ..................... 20176516

(51) Int. Cl.
*H03K 17/18* (2006.01)
*G01R 31/327* (2006.01)
*H01H 33/59* (2006.01)

(52) U.S. Cl.
CPC ........... *H03K 17/18* (2013.01); *H01H 33/596* (2013.01); *G01R 31/3275* (2013.01)

(58) Field of Classification Search
CPC ... H03K 17/18; H01H 33/596; G01R 31/3275
See application file for complete search history.

(56) References Cited

U.S. PATENT DOCUMENTS 7,567,095 B2    7/2009  Oster .............................. 326/82
8,717,032 B2 *  5/2014  Horman ................. H03K 17/18
                                                           361/93.7

(Continued)

FOREIGN PATENT DOCUMENTS

DE    102 12 164    10/2002
FR      2991461     12/2013

OTHER PUBLICATIONS

Search Report for International Application No. PCT/EP2021/055834, 10 pages, Jun. 23, 2001.

(Continued)

*Primary Examiner* — Ryan Johnson
*Assistant Examiner* — Colleen J O Toole
(74) *Attorney, Agent, or Firm* — Slayden Grubert Beard PLLC

(57) ABSTRACT

Various embodiments of the teachings herein include a switching device for a DC voltage grid. The device may include: a first controllable semiconductor switch with a control contact and two load contacts; and a controller for the first switch using a control signal at the control contact. The controller is configured to: actuate the first switch using a control pulse that causes the electrical conductivity of the semiconductor switch to reduce for less than 1 ms; apply a current to a test circuit including the first switch; ascertain a first value representing the voltage or the change in voltage across the first switch as a result of the control pulse and the applied current; analyzing the first value; and generating a signal that represents the functionality of the first semiconductor switch.

10 Claims, 2 Drawing Sheets

(56) References Cited

U.S. PATENT DOCUMENTS

2002/0135235 A1 9/2002 Winick .................. 307/87
2013/0009491 A1 1/2013 Häfner .................. 307/113

OTHER PUBLICATIONS

Search Report for EP Application No. 20176516.1, 7 pages, Nov. 5, 2020.

\* cited by examiner

SWITCHING DEVICE FOR A DC VOLTAGE GRID AND OPERATING METHOD FOR THE SWITCHING DEVICE

CROSS-REFERENCE TO RELATED APPLICATIONS

This application is a U.S. National Stage Application of International Application No. PCT/EP2021/055834 filed Mar. 9, 2021, which designates the United States of America, and claims priority to EP Application No. 20176516.1 filed May 26, 2020, the contents of which are hereby incorporated by reference in their entirety.

TECHNICAL FIELD

Switching devices for DC voltage grids are used in such grids in order to isolate individual consumers, but also sub-grids (grid branches or load areas) from the rest of the DC voltage grid. This isolation can be an intentional deactivation by way of a switching command from a superordinate controller, or else can be effected by the switching device itself in the sense of a protective function, for example in the event of a fault.

It has proven advantageous in this case to use controllable semiconductor switches such as, for example, IGBTs in such switching devices. In this case, at least one of the semiconductor switches of a switching device is typically arranged in the load current path and, in the activated state, accepts the full load current. The semiconductor switch is therefore permanently activated during normal operation. During such normal operation, it is therefore possible to identify only defects that allow the switch to become highly resistive. All defects that result in the switch no longer being able to build up blocking voltage are identified only at the next deactivation, that is to say when the switch fails. In this case, the installation is no longer protected.

In the case of bidirectional switching devices, two semiconductor switches are generally arranged in anti-series in the load current path. Semiconductor switches that are frequently used are those that comprise, as a component or intrinsically, a parallel freewheeling diode, for example IGBTs. In the case of such switches, it remains unidentified, even during the next deactivation, that one of the semiconductor switches is defective in the on state if the current direction is such that the freewheeling diode prevents the build-up of voltage across this semiconductor switch, i.e. the other—non-defective—of the two semiconductor switches builds up the blocking voltage.

SUMMARY

Teachings of the present disclosure include switching devices and/or methods that avoid the abovementioned drawback, in particular that allows a function test irrespective of the current direction. As an example, some embodiments include a switching device (14) for a DC voltage grid (10), comprising: a first controllable semiconductor switch (151, 155) that has a control contact and two load contacts, and a controller (152) for the first semiconductor switch (151, 155), configured to control the first semiconductor switch (151, 155) by means of an electrical control signal at the control contact, wherein the controller (152) is configured to: actuating the first semiconductor switch (151, 155) using a control pulse that, in the case of a functional semiconductor switch (151, 155), causes the electrical conductivity of the semiconductor switch (151, 155) to reduce for a time period of less than 1 ms, applying a current to a test circuit (41, 42) that comprises the first semiconductor switch (151, 155), ascertaining a first value representing the voltage or the change in voltage across the first semiconductor switch (151, 155) as a result of the control pulse and the application, and ascertaining from the first value, and outputting, a signal that represents the functionality of the first semiconductor switch (151, 155).

In some embodiments, the controller (152) is configured to use less than 10 µs as the time period.

In some embodiments, the controller (152) is configured to deactivate the semiconductor switch (151, 155) using the control pulse.

In some embodiments, there is a second controllable semiconductor switch (151, 155), wherein the controller (152) is configured to actuate both semiconductor switches (151, 155) using the control pulse.

In some embodiments, the semiconductor switches (151, 155) each comprise a parallel freewheeling diode (153, 156) and are connected in anti-series, wherein the control pulse causes a build-up of voltage at the second semiconductor switch (151, 155), whereas the build-up of voltage at the first semiconductor switch (151, 155) is limited by the freewheeling diode (153, 156), wherein the controller (152) is configured to: ascertaining a second value representing the voltage or the change in voltage across the second semiconductor switch (151, 155) as a result of the control pulse, and ascertaining from the values, and outputting, a signal that represents the functionality of both semiconductor switches (151, 155).

In some embodiments, there is a test circuit (41, 42) for each of the semiconductor switches (151, 155).

In some embodiments, the test circuit (41, 42) comprises a resistive voltage divider, the semiconductor switch (151, 155) being connected in parallel with a resistor (414, 424) of said voltage divider.

In some embodiments, the resistors (413, 414, 423, 424) of the resistive voltage divider have resistance values of less than 10 kohm, in particular less than 5 kohm.

As another example, some embodiments include an operating method for a switching device (14) for a DC voltage grid (10) comprising a first controllable semiconductor switch (151, 155) that has a control contact and two load contacts, in which the first semiconductor switch (151, 155) is controlled by means of an electrical control signal at the control contact, in which: the first semiconductor switch (151, 155) is actuated using a control pulse that, in the case of a functional semiconductor switch (151, 155), causes the electrical conductivity of the semiconductor switch (151, 155) to reduce for a time period of less than 1 ms, a current is applied to a test circuit (41, 42) that comprises the first semiconductor switch (151, 155), a first value representing the voltage or the change in voltage across the first semiconductor switch (151, 155) is ascertained as a result of the control pulse and the application, and a signal that represents the functionality of the first semiconductor switch (151, 155) is ascertained from the first value, and output.

In some embodiments, for a switching device (14) for a DC voltage grid (10), the switching device (14) has a first and a second controllable semiconductor switch (151, 155), wherein the semiconductor switches (151, 155) each comprise a parallel freewheeling diode (153, 156) and are connected in anti-series, in which: both semiconductor switches (151, 155) are actuated using the control pulse, as a result of which a build-up of voltage is caused at the second semiconductor switch (151, 155), whereas the build-up of voltage at the first semiconductor switch (151, 155) is limited by the freewheeling diode (153, 156), a second value representing the voltage or the change in voltage across the second semiconductor switch (151, 155) is ascertained as a result of the control pulse, and a signal that represents the functionality of the semiconductor switches (151, 155) is ascertained from the first value and the second value, and output.

BRIEF DESCRIPTION OF THE DRAWINGS

The teachings of the present disclosure are described and explained in more detail in the text that follows on the basis of the exemplary embodiments illustrated in the figures.

In the figures.

DETAILED DESCRIPTION

Figure 1:
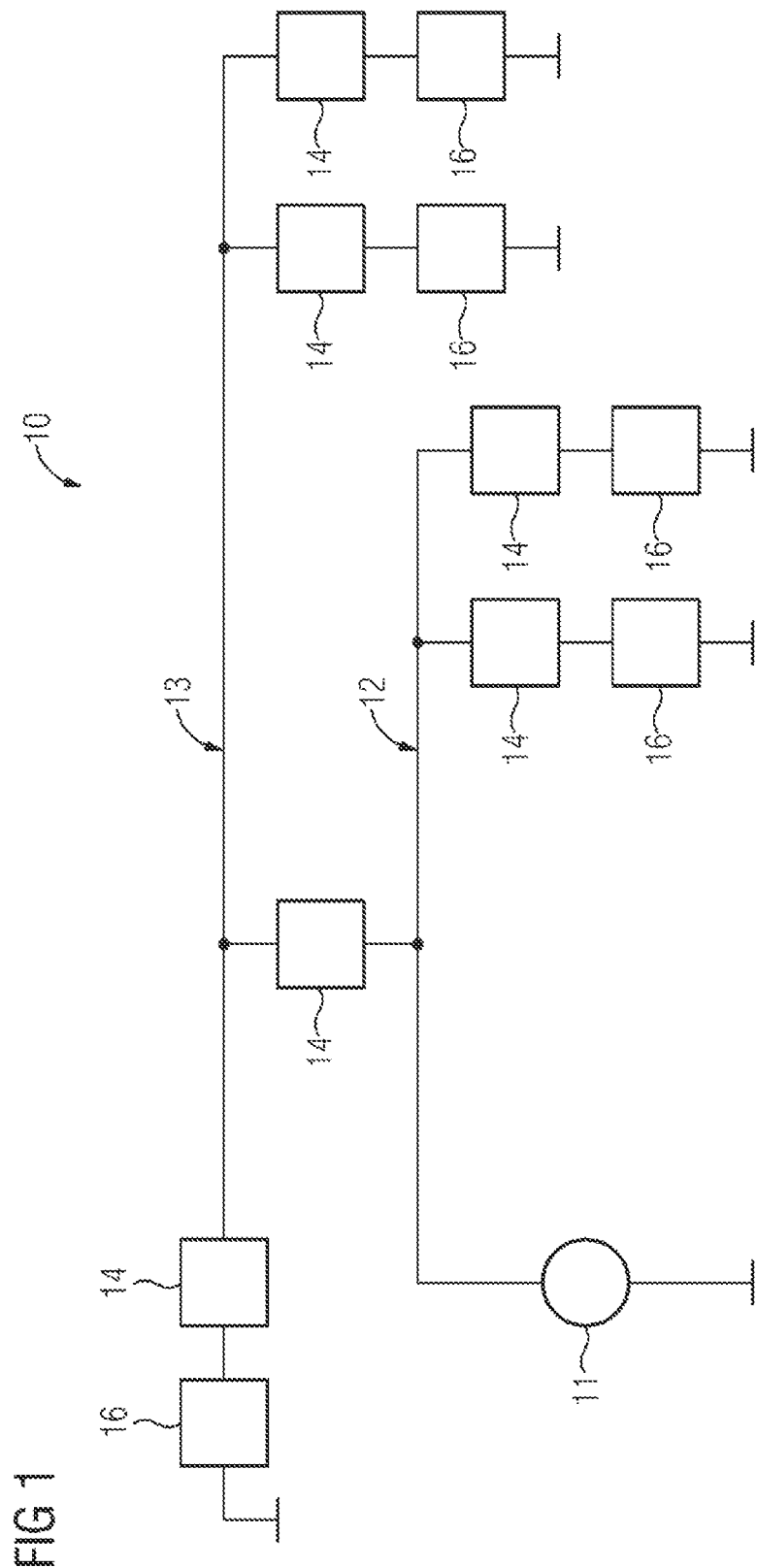
FIG. 1 schematically shows a DC voltage network with sub-grids.

The switching devices for a DC voltage grid described herein have a first controllable semiconductor switch, for example an IGBT, that has a control contact and two load contacts. Furthermore, the switching device comprises a controller for the first semiconductor switch, which controller is configured to control the first semiconductor switch by means of an electrical control signal at the control contact, that is to say using a voltage at the gate or a control current, for example. The controller is configured to actuate the first semiconductor switch using a control pulse that, in the case of a functional semiconductor switch, causes the electrical conductivity of the semiconductor switch to reduce for a time period of less than 1 ms.

Furthermore, the switching device is configured to apply a current to a test circuit, wherein the test circuit comprises the first semiconductor switch. A first value representing the voltage or the change in voltage across the first semiconductor switch is detected and ascertained as a result of the control pulse and the application. A signal that represents the functionality of the first semiconductor switch is in turn ascertained from the first value, and output.

Deactivating the first semiconductor switch and applying the current to the test circuit that comprises the first semiconductor switch therefore advantageously enables a function test for the switch that is not dependent on the first semiconductor switch also actually building up a blocking voltage itself. In some embodiments, the switching device comprises a second controllable semiconductor switch. In this case, the controller can be configured to actuate both semiconductor switches using the control pulse in order to deactivate the load current for a short time. In some embodiments, the switching device comprises a discharge network that is arranged in parallel with the semiconductor switches and accepts the load current for the short time period of the deactivation, and in the process builds up a voltage that is not excessively high.

If the semiconductor switches each comprise a parallel freewheeling diode and are connected in anti-series, the control pulse causes a build-up of voltage at only one of the two semiconductor switches. Which of the two semiconductor switches is involved depends on the current direction of the load current. In the text that follows, it is assumed that it is the second semiconductor switch. The build-up of voltage at the first semiconductor switch is then limited by the freewheeling diode. The controller can be configured to additionally ascertain a second value representing the voltage or the change in voltage across the second semiconductor switch as a result of the control pulse. A signal that represents the functionality of both semiconductor switches is determined from both ascertained values, and output.

Further advantageous configurations of the switching device incorporating teachings of the present disclosure and of the operating methods can be combined with the features of one of the dependent claims or also with those from a plurality of embodiments. Accordingly, the following features can also additionally be provided:

The controller can be configured to use less than 10 µs, in particular less than 5 µs, as the time period. These short switching times may have a very small influence on the ongoing operation. The build-up of voltage that results from the energy stored in the DC voltage grid by way of capacitors, present in parallel with the semiconductor switches, for example of a discharge network, therefore remains low. Specifically for capacitive loads, the compensation current is therefore kept low during reactivation.

In some embodiments, the controller can be configured to bring about reduced conductivity of the semiconductor switch or semiconductor switches using the control pulse, but not deactivation. While the corresponding actuation circuit, for example gate circuitry, has to be suitable for this purpose, this allows a smoother function test with fewer repercussions on the grid operation than complete deactivation.

The controller can alternatively be configured to completely deactivate the semiconductor switch or switches using the control pulse, that is to say—provided they are functional—to bring them into the off state. This produces a clearer signal in comparison with reducing the conductivity, and the actuation of the control contact does not require any additional effort, since deactivation has to be possible in any case.

If the switching device comprises two semiconductor switches, it can also have a test circuit for each of the semiconductor switches. Since the test circuit is necessary for the function test of that semiconductor switch which remains substantially voltage-free during deactivation, the enables the function test of both semiconductor switches irrespective of the current direction. The test circuit can comprise a resistive voltage divider, the first or the second semiconductor switch being connected in parallel with a resistor of said voltage divider. This enables a simple and direct conversion of the blocking capability of the semiconductor switch into a representative value—a voltage.

In some embodiments, the resistors of the resistive voltage divider can have resistance values of less than 10 kohm, in particular less than 5 kohm. The values of the resistors and an applied test voltage result in the flow of current through the load contacts of the semiconductor switch to be tested. The flow of current in turn sets the speed at which a voltage is built up across the deactivated semiconductor switch if its blocking capability is present. This establishes the speed of the measurement. The values mentioned may allow sufficiently fast measurement in the time window that defines the deactivation by way of the control pulse and that, depending on the configuration, is only 10 µs or less.

In the operating method, for a switching device for a DC voltage grid, which has a first controllable semiconductor switch comprising a control contact and two load contacts, the first semiconductor switch is controlled by means of an electrical control signal at the control contact, and the first semiconductor switch is furthermore actuated using a control pulse that, in the case of a functional semiconductor switch, causes the electrical conductivity of the semiconductor switch to reduce for a time period of less than 1 ms. A current is applied to a test circuit, wherein the test circuit comprises the first semiconductor switch. A first value representing the voltage or the change in voltage across the first semiconductor switch is ascertained as a result of the control pulse and the application of the current, and a signal that represents the functionality of the first semiconductor switch is ascertained from the first value, and output.

In some embodiments, the possibility of reliably assessing the functionality of the switching device, especially in those with semiconductor switches connected in anti-series, is provided. By way of example, the test can make it possible to identify failures on account of aging, spontaneous failure of components or overloading, for example as a result of excessively high temperature or voltage, in good time. This prevents damage due to subsequent faults or production downtimes on account of failure of the protection or switching function, increases the availability of an electrical installation connected to a power grid, and can additionally increase the intervals of time between maintenance intervals.

In some embodiments, the test can be carried out during ongoing operation in this case. There is therefore no need to deactivate the, or every, connected consumer to test the switching device. It does not matter here that both current directions arise within one test interval. In some embodiments, a test is possible even if there is no load current at all present.

FIG. 1 shows a schematic DC voltage grid 10 or DC network 10 incorporating teachings of the present disclosure. The DC network 10 comprises a DC voltage source 11 that supplies a DC voltage to the DC network 10. By way of example, the DC voltage source 11 can be a rectifier that is connected to a supply network. It is also possible, however, for the DC voltage source to be a generator in conjunction with a rectifier.

The DC network 10 furthermore comprises a number of network subscribers 16. In FIG. 1, these network subscribers 16 are all shown as being of the same type, but actually it goes without saying that the network subscribers 16 can have very different properties. One or more of the network subscribers 16 can therefore be a partially capacitive or inductive load instead of a purely resistive load. By way of example, some of the network subscribers 16 can be electric motors. It is likewise possible for network subscribers 16 to be prosumers, that is to say they not only act as energy consumers, but can also feed electrical energy back into the DC network 10. By way of example, network subscribers 16 can include an accumulator. Finally, some of the network subscribers 16 can also be or contain generators, for example a photovoltaic installation.

The exemplary DC network 10 shown in FIG. 1 comprises a first and a second sub-network 12, 13. The first sub-network 12 comprises the DC voltage source 11 and some of the network subscribers 16. The second sub-network 13 comprises some further network subscribers 16. The two sub-networks 12, 13 are connected to one another in the DC network 10 via a DC voltage switch 14 or DC switch 14 for short. The sub-networks 12, 13 can therefore be isolated from one another by the DC switch 14. Since the direction of current flow cannot be reliably defined in the case of the DC switch 14, it is a bidirectional DC switch 14.

Close to the further network subscribers 16, the DC network also comprises a respective DC switch 14. For some applications, it would be possible for unidirectional DC switches to be used here.

For this example, it is however assumed that bidirectional DC switches 14 are also used close to the network subscribers 16.

Figure 2:
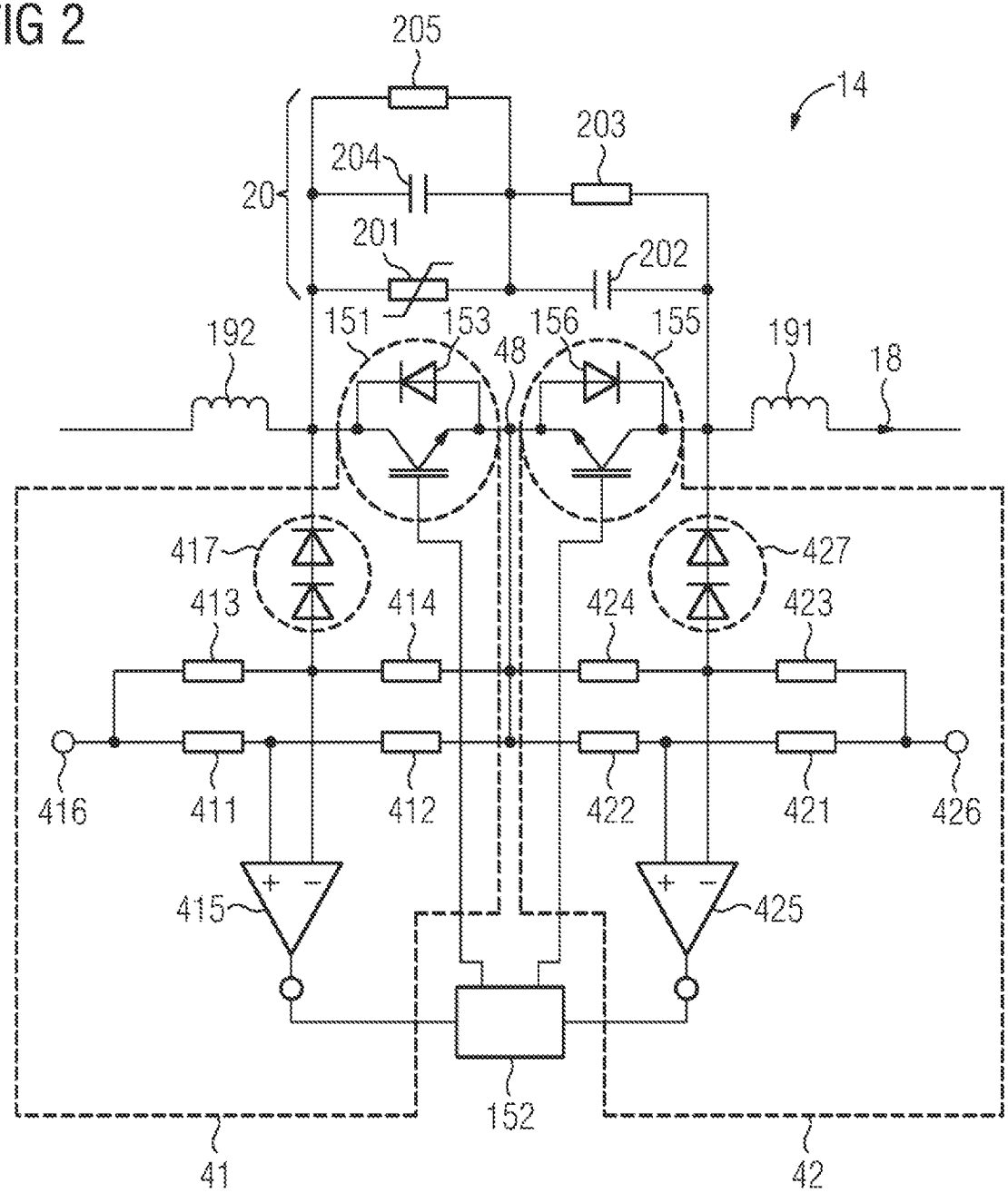
FIG. 2 schematically shows a bidirectional DC voltage switch with a discharge network and test circuits.

FIG. 2 shows such a bidirectional DC switch 14 as is used in the exemplary DC network 10 incorporating teachings of the present disclosure. The DC switch 14 comprises a first IGBT 151 with a parallel freewheeling diode 153. The DC switch 14 also comprises a controller 152 that is connected to the gate connection of the IGBT 151 and actuates it during operation of the DC switch 14 by way of control signals in the form of different voltage levels. In addition, said DC switch has a second IGBT 155 that is connected in anti-series, that is to say in series and in the opposite orientation, with the IGBT 151. The second IGBT 155 also has a parallel freewheeling diode 156 that is likewise arranged counter to the orientation of the freewheeling diode 153. The second IGBT 155 is also controlled by the controller 152, that is to say is supplied with a gate voltage. The DC switch 14 of FIG. 2 is therefore a bidirectional DC switch, and can deactivate a load current irrespective of the direction thereof.

The DC switch 14 furthermore comprises a discharge network 20. Said discharge network has three branches, of which a first and a second are connected in parallel with one another and in parallel with the two IGBTs 151, 155. The first branch comprises a series connection of a varistor 201 with a capacitor 202. The second branch comprises a series connection of a resistor 203 with a second capacitor 204. The third branch comprises a second resistor that is connected in parallel with the second capacitor 204. The central connections between the elements in the first and the second branch are likewise connected.

The discharge network 20 ensures that the energy stored inductively in the DC network 10, i.e. for example in the line inductors 191, 192, is reduced by the DC switch 14 during deactivation without causing overvoltages that cause damage to the IGBTs 151, 155. In addition to the form for the discharge network 20 that is shown in FIG. 2, there are other forms that can also undertake the tasks described above.

The DC switch 14 is integrated in series in a DC line in which a current flows in the current direction 18. A defect in the DC switch 14 that causes a highly resistive state that is permanent and undesired, i.e. that is not effected by the controller 152, can therefore be identified directly during ongoing operation. In contrast, a state in which the switch permanently remains at low resistance cannot be identified directly, but rather only at the next attempted deactivation, if this does not work. The controller 152 of the DC switch 14 is therefore configured to carry out a short deactivation of the IGBTs 151, 155 using a suitable control pulse so as to test the function of the DC switch 14, that is to say of the IGBTs 151, 155.

Provided the IGBTs 151, 155 are in operation, the discharge network 20 accepts the load current. As a result of the discharge network 20 having capacitors in the current path, brief deactivation of the IGBTs 151, 155 results in an approximately linear increase of the voltage across the DC switch 14, while the load current flows via the discharge network 20 and the capacitors 202, 204 are charged. This only applies if the IGBTs 151, 155, upon a control pulse of the controller 152 that normally brings about a deactivation, for example a drop in the gate voltage, also actually leads to the IGBTs 151, 155 changing to the off state. By detecting the voltage across the IGBTs 151, 155, it can therefore be ascertained whether the IGBTs 151, 155 react to the control pulse as intended. If this is the case, there is a build-up of voltage in response to the control pulse. If there is no build-up of voltage, or a build-up of voltage that is too small, there is a malfunction. By way of example, a threshold voltage can be provided so as to establish the fault situation. If this is not reached, owing to the control pulse, the malfunction is present.

In some embodiments, the deactivation time is such that the voltage difference between the input and output of the DC switch 14 during the duration of the control pulse does not become too great. A duration for the control pulse that is less than 1 ms is expedient for this. In particular, durations of less than 10 µs are already sufficient for a function test of the DC switch 14. Small durations in the µs range generally keep the influence of the function test on ongoing operation small and, especially in the case of capacitive loads, keep the compensation current low during reactivation, i.e. at the end of the control pulse.

In some embodiments, the control pulse is such that it does not bring about deactivation of the IGBTs 151, 155, and instead only a reduction of the conductivity. By way of example, the reduction of the gate voltage can be smaller than would be necessary for complete deactivation of the IGBTs 151, 155. The IGBTs 151, 155 then continue to operate in the active region and conduct the load current. Nevertheless, the voltage across the IGBTs 151, 155 rises as a result of the control pulse. This enables a function test for the IGBTs 151, 155, in which the resulting voltage across the IGBTs 151, 155 is lower in the event of complete deactivation, and therefore problems involving overvoltage or compensation currents with the same period of the control pulse are smaller. In return, the controller 152 has to be configured to be able to produce an appropriate control pulse, that is to say a reduction in the gate voltage, for example.

Since the IGBTs 151, 155 each have a parallel freewheeling diode 153, 156, the build-up of voltage that results owing to the control pulse actually substantially only affects one of the IGBTs 151, 155. On the other hand, the build-up of a voltage at the other IGBT 151, 155 is prevented by the freewheeling diode 153, 156. Which of the two IGBTs 151, 155 remains virtually voltage-free in this case depends on the direction of the flowing load current. If the load current in FIG. 2 flows from the side of the IGBT 151 to the side of the IGBT 155, the build-up of voltage occurs at the IGBT 151. Otherwise, there is only a build-up of voltage across the IGBT 155.

Using the described method to ascertain whether the IGBTs 151, 155 are defective in the on state, it is therefore only actually possible to test one of the two IGBTs 151, 155 as long as both load current directions are not available for the measurement. If the load current is removed completely for a period of time, not even one of the two IGBTs 151, 155 can be tested. In order to confront this problem, the DC switch 14 additionally comprises a first and a second test circuit 41, 42, wherein the first test circuit 41 is used for testing the function of the first IGBT 151 and the second test circuit 42 for testing the function of the second IGBT 155. The first and the second test circuit 41, 42 are of mirror-image construction.

They each comprise a first voltage divider that is formed by a first and a second test resistor 411, 412, 421, 422. They furthermore comprise a second voltage divider that comprises a third and a fourth test resistor 413, 414, 423, 424. The first and the second voltage divider are connected to one another at one of the outer connections thereof, and connected to the node 48 between the two IGBTs 151, 155, that is to say to their emitters. The other outer connections are connected to an auxiliary potential 416, 426 that is, for example, +15 V with respect to the node 48.

The center point of the second voltage divider is connected to the collector of the respective IGBT 151, 155 via one or more decoupling diodes 417, 427 that have to be able to block the voltage present during operation. Furthermore, the center point of the second voltage divider is connected to the inverting input of an operational amplifier 415, 425 of the respective test circuit 41, 42. The center point of the first voltage divider is connected to the non-inverting input of the respective operational amplifier 415, 425. The outputs of the operational amplifiers 415, 425 are connected to the controller 152 and forward the result of the function test to the controller 152.

The first voltage dividers form a reference voltage. By way of example, resistance values of 1 kohm for the respective first test resistor 411, 421 and 2 kohm for the respective second test resistor 412, 422 can be used, which in the example provided here results in a reference voltage of 10 V at the non-inverting input of the operational amplifier 415, 425.

For the second voltage divider, resistance values of 1 kohm for the respective third test resistor 413, 423 and 3 kohm for the respective fourth test resistor 414, 424 can be used, for example. One of the two IGBTs 151, 155 is connected in parallel with the respective fourth test resistor 414, 424. The IGBTs 151, 155 are therefore also part of the respective test circuit 41, 42.

If a respective IGBT 151, 155 is functional, that is to say actually highly resistive, in the short time period in which the two IGBTs 151, 155 are deactivated by the control pulse, this results in a voltage corresponding to the second voltage divider, that is to say 11.25 V, at the inverting input of the respective inverting input of the operational amplifier 415, 425. Since this voltage is higher than the reference voltage, the respective operational amplifier 415, 425 outputs a "low" signal at the output, which can be processed as a signal for a functional IGBT 151, 155.

On the other hand, if the tested IGBT 151, 155 is in the on state, that is to say defective, in spite of the control pulse, the voltage at the inverting input falls to a value that corresponds to the sum of the forward voltages of the decoupling diodes 417, 427 and IGBTs 151, 155, that is to say approximately 3 V, with respect to the node 48. As a result, the respective operational amplifier 415, 425 outputs a "high" signal at the output, which can be processed as a signal for an IGBT 151, 155 that is defective in the on state.

Since a measurement that is as fast as possible is of interest for this measurement function, in contrast to known saturation measurements for IGBTs, higher currents are used, and therefore lower resistances of the third and fourth test resistors 413, 414, 423, 424. This therefore provides a DC switch 14 that is capable of testing its controllable semiconductor switches during ongoing operation, that is to say under load current, to determine whether they are defective in the on state and of identifying a corresponding defect before the next deactivation operation is actually due. In this case, it is also possible to test that one of two anti-series IGBTs 151, 155 that cannot be energized even by a deactivation due to the current direction. This takes advantage of the fact that the discharge network accepts the load current during deactivation and a current can be applied to the voltage-free IGBT 151, 155 involved. The voltage drop that only results in the case of a functioning IGBT 151, 155 is evaluated as a signal for the function test.

Furthermore, the construction of the DC switch according to FIG. 2 even allows a function test in the load current-free state. If there is no load current at all in the respective sub-grid 12, 13 in which the DC switch 14 is arranged, the blocking capability and the conductivity can even be tested by applying the current by way of the test circuits 41, 42, wherein the controller 152, for this purpose, has to activate and deactivate the IGBTs 151, 155 appropriately for short intervals of time.

In some embodiments, the evaluation of the resulting voltages by way of deactivation and application of a current can be carried out in different ways, for example in an analog or digital manner, by way of a comparator or, for example, by direct connection to a microcontroller. A resulting signal that represents the functionality of the IGBTs 151, 155 can likewise assume different forms. The signal can therefore be stored in a protocol, output as an optical or acoustic signal, or supplied to a superordinate controller or evaluation unit as an electrical signal, or several of these possibilities.

LIST OF REFERENCE SIGNS

10 DC network
11 DC voltage source
12, 13 Sub-grids
14 DC switch
16 Network subscriber
151, 155 IGBT
152 Controller
153, 156 Freewheeling diode
154 Parasitic capacitance
18 Load current
191, 192 Line inductor
20 Discharge network
201 Varistor
202, 204 Capacitor
203, 205 Discharge resistor
41, 42 Test circuit
411 . . . 414 Test resistor
421 . . . 424 Test resistor
415, 425 Operational amplifier
416, 426 Auxiliary potential
417, 427 Decoupling diodes
48 Node

What is claimed is:

1. A switching device for a DC voltage grid, the device comprising:
    a first controllable semiconductor switch with a control contact and two load contacts; and
    a controller for the first semiconductor switch configured to control the first semiconductor switch using an electrical control signal at the control contact;
    wherein the controller is configured to:
        actuate the first semiconductor switch using a control pulse that, in the case of a functional semiconductor switch, causes the electrical conductivity of the semiconductor switch to reduce for a time period of less than 1 ms, the first semiconductor switch remaining active during the time period;
        apply a current to a test circuit including the first semiconductor switch;
        ascertain a first value representing the voltage or the change in voltage across the first semiconductor switch as a result of the control pulse and the applied current;
        analyzing the first value; and
        generating a signal that represents the functionality of the first semiconductor switch.

2. The switching device as claimed in claim 1, wherein the time period is less than 10 µs.

3. The switching device as claimed in claim 1, wherein the controller is further configured to deactivate the semiconductor switch using the control pulse.

4. The switching device as claimed in claim 1, further comprising a second controllable semiconductor switch, wherein the controller is configured to actuate both semiconductor switches using the control pulse.

5. The switching device as claimed in claim 4, wherein:
    the semiconductor switches each comprise a parallel freewheeling diode and are connected in anti-series;
    the control pulse causes a build-up of voltage at the second semiconductor switch, whereas the build-up of voltage at the first semiconductor switch is limited by the freewheeling diode;
    the controller is further configured to:
    ascertaining a second value representing the voltage or the change in voltage across the second semiconductor switch as a result of the control pulse;
    analyzing the values; and
    transmitting a signal representing functionality of both semiconductor switches.

6. The switching device as claimed in claim 4, further comprising a test circuit for each of the semiconductor switches.

7. The switching device as claimed in claim 1, wherein:
    the test circuit comprises a resistive voltage divider; and
    the semiconductor switch is connected in parallel with a resistor of said resistive voltage divider.

8. The switching device as claimed in claim 7, wherein resistors of the resistive voltage divider have resistance values of less than 10 kohm.

9. An operating method for a switching device for a DC voltage grid comprising a first controllable semiconductor switch with a control contact and two load contacts, in which the first semiconductor switch is controlled by an electrical control signal at the control contact, the method comprising:
    actuating the first semiconductor switch using a control pulse that, in the case of a functional semiconductor switch, causes the electrical conductivity of the semiconductor switch to reduce for a time period of less than 1 ms, the first semiconductor switch remaining active during the time period;
    applying a current to a test circuit including the first semiconductor switch;
    ascertaining a first value representing the voltage or the change in voltage across the first semiconductor switch resulting from the control pulse and the applied current;
    generating a signal representing functionality of the first semiconductor switch based on the first value; and
    transmitting the signal.

10. The operating method, as claimed in claim 9, for a switching device for a DC voltage grid, wherein the switching device has a first and a second controllable semiconductor switch, wherein the semiconductor switches each comprise a parallel freewheeling diode and are connected in anti-series, further comprising:
    actuating both semiconductor switches using the control pulse, as a result of which a build-up of voltage is caused at the second semiconductor switch, whereas the build-up of voltage at the first semiconductor switch is limited by the freewheeling diode;

ascertaining a second value representing the voltage or the change in voltage across the second semiconductor switch resulting from the control pulse;
generating a signal representing functionality of the semiconductor switches based on the first value and the second value; and
transmitting the signal.

\* \* \* \* \*